United States Patent
Kufer

(10) Patent No.: US 10,333,603 B2
(45) Date of Patent: Jun. 25, 2019

(54) METHOD FOR CONTROLLING DIGITAL-TO-ANALOGUE CONVERTERS AND RF TRANSMIT CIRCUIT ARRANGEMENT

(71) Applicant: Rohde & Schwarz GmbH & Co. KG, München (DE)

(72) Inventor: Wolfgang Kufer, Mühldorf (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 15/603,621

(22) Filed: May 24, 2017

(65) Prior Publication Data

US 2018/0091203 A1    Mar. 29, 2018

(30) Foreign Application Priority Data

Sep. 27, 2016 (EP) ..................................... 16190818

(51) Int. Cl.
*H04B 7/06* (2006.01)
*G01S 7/42* (2006.01)
(Continued)

(52) U.S. Cl.
CPC .............. *H04B 7/0617* (2013.01); *G01S 7/42* (2013.01); *G06F 1/10* (2013.01); *H01Q 3/38* (2013.01); *H03M 1/0624* (2013.01); *H03M 1/66* (2013.01)

(58) Field of Classification Search
CPC .... H04B 7/0617; H04B 1/0483; H04B 17/11; H04B 7/0413; H04B 7/0452; H04B 1/0475; H01Q 5/30; H04W 16/28; Y02D 70/1262
(Continued)

(56) References Cited

U.S. PATENT DOCUMENTS

| 7,394,424 B1 * | 7/2008 | Jelinek | H01Q 3/2682 342/375 |
| 8,565,345 B2 * | 10/2013 | Gupta | H03K 17/92 370/358 |

(Continued)

OTHER PUBLICATIONS

Extended European Search Report for European Patent Application No. 16190818.1, dated Mar. 6, 2017, 10 pages.
(Continued)

*Primary Examiner* — Leila Malek
(74) *Attorney, Agent, or Firm* — Westman, Champlin & Koehler, P.A.

(57) ABSTRACT

The invention relates to a method for controlling digital-to-analog converters (DAC), the method comprising: providing a plurality of digital-to-analog converters (DAC) of a multi-channel converter array wherein each DAC includes a separate clock generator; generating, by each clock generator, a RF carrier signal; converting, by each DAC, digital data signals into analog RF data signals based on the carrier signals of the corresponding clock generators; providing a separate control signal for each clock generator wherein the control signals comprise control information such that when the control signals are applied to the corresponding clock generators the different analog RF data signals provided at respective output terminals of each DAC comprise a predefined phase shift to each other; controlling the clock generator of each DAC directly and independently based on the provided control signals. The invention further relates to a converter arrangement RF transmit circuit arrangement.

17 Claims, 2 Drawing Sheets

(51) Int. Cl.
*H01Q 3/38* (2006.01)
*H03M 1/66* (2006.01)
*G06F 1/10* (2006.01)
*H03M 1/06* (2006.01)

(58) Field of Classification Search
USPC .......................................................... 375/299
See application file for complete search history.

(56) References Cited

U.S. PATENT DOCUMENTS

2008/0240170 A1    10/2008  Elmala et al.
2013/0107978 A1*   5/2013   Thaller ................ H03B 5/1228
                                              375/295
2015/0234535 A1*   8/2015   Hotelling .............. G06F 3/0416
                                              345/173

OTHER PUBLICATIONS

Diniz, George, "Using JESD204B for wideband data converter apps", EE Times-Asia/eetasia.com, 2012, eMedia Asia Ltd., 4 pages.

* cited by examiner

METHOD FOR CONTROLLING DIGITAL-TO-ANALOGUE CONVERTERS AND RF TRANSMIT CIRCUIT ARRANGEMENT

CROSS-REFERENCE RELATED TO APPLICATIONS

This application is a non-provisional application which claims priority to European Patent Application No. 16190818.1, filed on Sep. 27, 2016, with the European Patent Office, the contents of which is hereby incorporated by reference in its entirety.

FIELD OF THE INVENTION

The invention relates to a method for controlling digital-to-analogue converters. The invention further relates to a RF transmit circuit arrangement.

TECHNICAL BACKGROUND

Wireless communication systems are widely deployed to provide various types of communication contents such as voice, video, data and the like. Transceiver devices for wireless communication systems typically comprise high speed analogue or digital front end (AFE, DFE) devices. These AFE/DFE devices typically comprise digital processors which are used to perform complex processing while adhering to reasonable power and size constraints. In order to transfer information to another radio device, the data signals are normally first converted into analogue signals which may then be sent by a suitable antenna. The conversion process is performed by digital-to-analogue converters.

In electronics, a digital-to-analogue converter (DAC, D/A, DA) is a device that converts a digital signal into an analogue signal. An analogue-to-digital converter (ADC) performs the reverse function. There are specific DAC architectures for different applications. For example, high-speed DACs are used to transmit at high data rates. These DAC types permit moving some of the traditional analogue functionality of a radio system into the digital domain, such as frequency up-conversion. One technique to improve the sampling rate of a DAC system is to use multiple DACs in parallel. A parallel DAC architecture typically includes multiple DACs whose outputs are combined in the analogue domain.

For high-speed DFE applications, a single DAC element uses an externally generated clock signal. This clock signal is used within the DAC to generate a carrier signal which is then modulated with the transmit data. However, one problem with this approach is a potential misalignment of the different output signals of the DAC elements of a multi DAC array with regard to their phase shift. As a consequence of this, the clock generators which are triggering the DAC elements have to be reset regularly and sometimes for each data sample in order to ensure a predefined phase shift. However, for high-speed applications, in particular for wireless RF data communication, this resetting is decreasing the data throughput significantly.

A predefined phase shift is in particular essential for beamforming. Beamforming is used for transmitting RF signals in order to generate a predefined beam form. With the beamforming technique, so-called smart multiple antennas are used. Smart antennas are arrays of antenna elements, wherein each of these antenna elements receive an analogue signal from a DAC. This analogue signals are to be transmitted with a predetermined phase offset and a relative gain. The net effect of the array is to direct a transmit beam in a predefined direction. The beam is steered by controlling the phase and gain relationships of the signals that excite the antenna elements of the array. However, in case, that the different transmit signals are not sent at a predefined point of time from the different antenna elements, it will be nearly impossible to obtain a predefined form of the beam.

U.S. Pat. No. 8,286,067 B2 describes a method for transmitting sampled data and control information between a digital signal processor and an RF analogue front end device. The analogue front end device comprises two DACs within the transmit path. The clock signal for triggering these DACs is generated externally. For a given clock rate, the serial interface transmitter of the analogue front end device provides variable data rates by inserting null frames to match the data rate to the clock rate. The null frames may be identified by specific codes within the control field. Thus, U.S. Pat. No. 8,286,067 B2 discloses a method for controlling multiple DACs within a modem, wherein the control data for controlling the DACs is included within the transmitted data.

SUMMARY OF THE INVENTION

Against this background, there is the need to provide a stable phase difference between the output signals of the DAC elements of a DAC array.

According to aspects of the invention, the following is provided:

A method for controlling digital-to-analogue converters (DAC), the method comprising: providing a plurality of digital-to-analogue converters (DAC) of a multi-channel converter array wherein each DAC includes a separate clock generator; generating, by each clock generator, a RF carrier signal; converting, by each DAC, digital data signals into analogue RF data signals based on the carrier signals of the corresponding clock generators; providing a separate control signal for each clock generator wherein the control signals comprise control information such that when the control signals are applied to the corresponding clock generators the different analogue RF data signals provided at respective output terminals of each DAC comprise a predefined phase shift to each other; controlling the clock generator of each DAC directly and independently (i.e. individually) based on the provided control signals.

A RF transmit circuit arrangement, comprising: a digital interface circuit; a multi-channel converter array coupled on its digital input side to the digital interface circuit and having a plurality of digital-to-analogue converters (DAC) wherein each DAC includes a separate clock generator and wherein each DAC is configured to convert digital data signals provided by the digital interface circuit into analogue RF data signals; wherein the digital interface circuit further comprises a control circuit which is configured to provide control signals for controlling the clock generators of each DAC directly and independently (i.e. individually) and wherein each control signal comprises control information such that the different analogue RF data signals provided at respective output terminals of each DAC comprise a predefined phase shift to each other.

The present invention is based on the finding that analogue RF output signals which are provided at the output of a DAC array compulsory need a stable phase shift to each other for specific applications, in particular for time division multiplex applications, for beamforming or the like.

For this purpose, a first idea of the present invention is to shift the functionality of the clock generation inside every individual DAC element such that every DAC element is generating the carrier signal based on an internally generated clock signal. According to a second idea of the present invention each clock generator within a DAC element is triggered independently by a separate control signal. This control signal comprises phase shift information for the corresponding and is generated by the digital interface circuit. As a consequence, the different DAC elements within the DAC array are each triggered by separate control signals such that the corresponding analogue RF output signals which are provided on the respective output terminals of each DAC element comprise a predefined phase shift to each other.

With the present invention it is possible to synchronize the different digital channels such that they are operating with a predefined phase shift sample exact to each other.

Additionally, by using only one control signal for each DAC element it is possible to provide a very smart and easy approach for synchronizing the RF output signals generated by the DAC elements. This way, it is possible to provide predefined phasing of the RF output signals with the consequence that specific applications like beamforming are possible also for high speed applications.

Further, by employing individual control information for each clock generator separately, resetting the clock generators is avoided. By not resetting the clock generators regularly, the present invention is suitable for high performance and high speed applications.

Advantageous configurations and developments emerge from the further depending claims and from the description with reference to the figures of the drawings.

According to one aspect, the analogue RF data signals which are generated by the multi-channel converter array and which are provided at respective output terminals of the DAC are each forwarded to antenna elements of an antenna array. This antenna array is then transmitting over the air RF signals based on the analogue RF data signals.

According to a further aspect, the method is used for beamforming by setting a predefined shape of the beam. This predefined shape within the beam may be set via the control information of the control signal. Beamforming can be applied for radio or sound waves. Beamforming has various applications in radar, sonar, wireless communication, acoustics and biomedicine. For beamforming applications, typically a phased antenna array is used. A phased antenna array is an array of antennas in which the relative phases of the respective signals which are feeding the antennas are set in such a way that the effective radiation pattern of the array is reinforced in a desired direction and suppressed in undesired directions. It is very essential for those phased antenna arrays, that the phase relationships among the antennas may be fixed. In this case, however, it is essential to provide predefined phase shifts between the different analogue signals feeding the antenna elements. The present invention which provides such predefined phase shifts which enables a very smart beamforming technique.

According to a further aspect, the digital interface circuit is a JESD204 interface, in particular a JESD204B interface. Consequently, the digital data signals which are fed into the DACs of the RF converter array and the control signals which are supplied to the DAC and their NCOs, respectively, are generated based on the JESD204 or specifically on the JESD204B transport protocol standard. As the resolution and speed of ADCs and DACs has increased in recent times, the demand for a more efficient interface has grown. The JESD204 interface brings this efficiency and offers several advantages over CMOS and LVDS interfaces in terms of speed, size and cost. JESD refers to a data interface that is able to support the high bandwidth necessary for high performance, high speed and multi-channel applications. In addition, with JESD204 there is a significant reduction in input-output terminals which leads to smaller package sizes while reducing the number of digital input-outputs (IO) needed. Consequently, the JESD204 interface standard is easing board layout and circuitry. Very high speed ADCs and DACs, which are for example used for RF communication that would have previously required a complex interface design using a large number of FPGAs are now implemented within just a few IOs terminals. The total bandwidth of the JESD204 interface can also be separated into multi-channels based on the requirements of the application again without requiring additional IOs.

According to a further aspect, the method further comprises the steps of coding an information of the starting phase, an increment and a point of time of switching into the control signal. The DAC is then analyzing this information. Based on the analyzed information, the clock generator of the DAC is switched. This switching may be conducted sample exact. This means, that each clock generator of a DAC is controlled sample exact with regard to the data samples of the digital data signals provided to the corresponding DAC.

According to a further aspect, at least one control information per sample of the data signals is provided to each clock generator.

According to a further aspect, each DAC is individually synchronized with regard to the frequency and phase of the carrier signal. Additionally, or alternatively, each DAC is individually and independently synchronized with regard to the analogue RF data signals. In particular, the controlling and/or synchronizing of the clock generators of each DAC is directly, individually and independently performed without resetting the clock generators.

According to a further aspect, the digital serial interface circuit is a serial high-speed multi-channel time division multiplexing (TDM) interface.

According to a further aspect, at least one of the clock generators is a numerically controlled oscillator (NCO). A numerically controlled oscillator is a digital signal generator which creates a synchronous (i.e. clocked), discrete-time, discrete-valued representation of a specific waveform of the signal. Usually this specific waveform of the signal is sinusoidal. Numerically controlled oscillators offer several advantages over other types of oscillators in terms of agility, accuracy, stability and reliability. NCOs are very often used in communication systems, in particular for wireless communication, including digital up/down converters, digital PLLs, radar systems, drivers for optical or acoustic transmission, multilevel FSK/PSK modulators, demodulators and the like. Alternatively, the clock generator may also be a digitally controlled oscillator (DCO). A DCO is a hybrid digital/analogue electronic oscillator which is very often used in frequency synthesizers. DCOs are a kind of a voltage controlled oscillator (VCO) and are designed to overcome the tuning stability limitations of early VCO designs.

According to a further aspect, the RF transmit circuit arrangement further comprises an antenna array having a plurality of antenna elements. Each of these antenna elements is connected on their input terminals over data lines to a corresponding output terminal of a DAC. Analogue RF data signals which are generated by the DAC are provided over these data lines to the corresponding antenna elements.

According to a further aspect, the RF transmit circuit arrangement is configured to transmit radar signals. Additionally or alternatively, the RF transmit circuit arrangement is configured to transmit high speed wireless communication signals such as in particular according to the LTE or 5G standard.

According to a further aspect, the digital serial interface circuit is connected for the RF data transmission to each DAC via a plurality of data lines. Further, the digital serial interface circuit is connected to each DAC via a first control line for synchronizing the DACs with each other and via a second control line to the NCO for setting the predefined phase shift. Additionally, the RF transmit circuit arrangement comprises a digital input side coupled to the digital serial interface circuit and an analogue output side at the output of the converter arrangement.

Where appropriate, the above-mentioned aspects, configurations and developments can be combined in any suitable manner. Further possible aspects, configurations, developments and implementations of the invention also include combinations, which are not explicitly mentioned, of features of the invention which have been described previously or are described in the following with reference to the embodiments. In particular, in this case, a person skilled in the art will also add individual aspects as improvements or supplements to the basic form of the present invention.

CONTENTS OF THE DRAWINGS

The present invention is described in greater detail in the following on the basis of the embodiments shown in the schematic figures of the drawings, in which.

Figure 1:
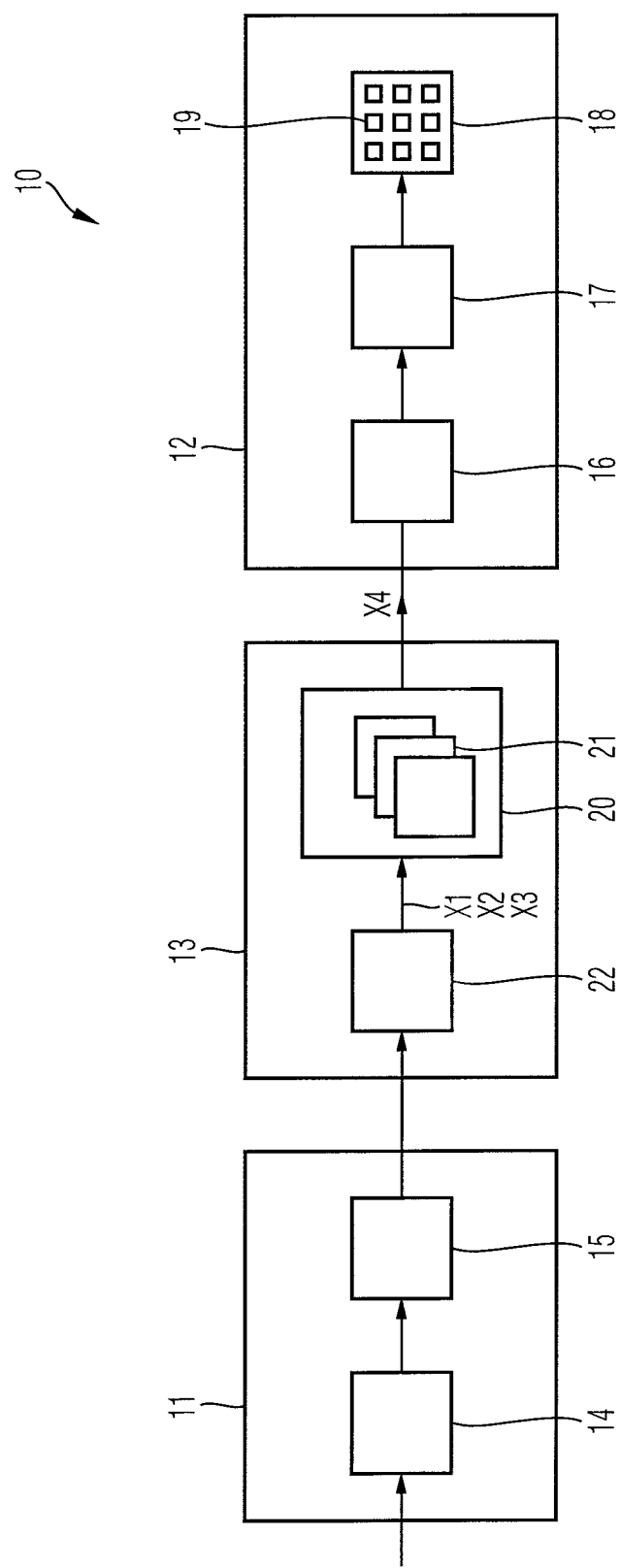
FIG. 1 illustrates a partial view of a telecommunication device which comprises a multi DAC arrangement according to the invention for interfacing between a digital section and an analogue section.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DESCRIPTION OF EMBODIMENTS

As a non-limiting example, FIG. 1 illustrates a partial view of a telecommunication device 10 which comprises a digital section 11, an analogue section 12 and a multi DAC (digital-to-analogue converter) arrangement 13 for interfacing between the digital and analogue sections 11, 12. The digital and analogue sections 11, 12 can contain any components typically included in a conventional telecommunication device 10. For example, the digital section 11 can include a data processor 14 such as a DSP (Digital Signal Processor), an ASIC (Application Specific Integrated Circuit) and/or a FPGA (Field Programmable Gate Array). The digital section 11 of the telecommunication device 10 typically comprises a digital radio circuit 15 such as a digital frequency up-converter. This digital radio circuit 15 may also be implemented as part of the DSP.

The analogue section 12 can include a filter 16, a power amplifier 17 and an output device 18. The analogue section 12 may also comprise other components, such as up-conversion circuits if for example frequency up-conversion is not performed by the digital section 11. The output device 18 comprises an antenna array 19 having a plurality of antenna elements for transmitting analog signals over the air (OTA) from the telecommunication device 10 to receiver devices, for example within a base station, a user equipment and the like. Alternatively, the output circuit 18 may comprise an array of output terminals.

The multi DAC arrangement 13 is configured to convert between digital signals from the digital section 11 to corresponding analogue signals towards the analogue section 12. For this purpose, the multi DAC arrangement 13 comprises a DAC array 20 having a plurality of single DACs 21, which hereinafter are also referred to as DAC element 21. The plurality of DACs 21 are arranged in parallel to each other for converting a digital signal from the digital section 11 to an analogue signal provided to the analogue section 12. Typically, each DAC path has a different analogue phase response. This can be achieved by using multiphase clocking to control operation of the DACs 21. In particular, the inputs and outputs of the DACs 21 can be delayed (i.e. phase shifted) with respect to each other in order to ensure that each DAC path has a different analogue phase response.

The multi DAC arrangement 13 further comprises a digital serial interface circuit 22 which is configured to provide a serial data stream X1 to the plurality of DACs 21. The digital serial interface circuit 22 further provides control information X2, X3 to each DACs 22. This control information X2, X3 comprises on the one hand side synchronization information X2 for synchronization of the different parallel arranged DAC elements 21. On the other hand side the control information X2, X3 comprises phase shift information X3 for setting a predefined phase shift for the analogue output data signals provided at the output side of the different DAC elements 21. The structure and functionality of the digital serial interface circuit 22 and DAC elements 21 is hereinafter described in more detail with regard to FIG. 2.

The digital serial interface circuit 22 may be implemented as part of the data processor 14 which is included in the digital section 11 of the telecommunication device 10. However, the digital serial interface circuit 22 may also be implemented separate from the data processor 14.

The telecommunication device 10 as a whole or parts of it denote the RF transmit circuit arrangement in the terminology of the present invention.

Figure 2:
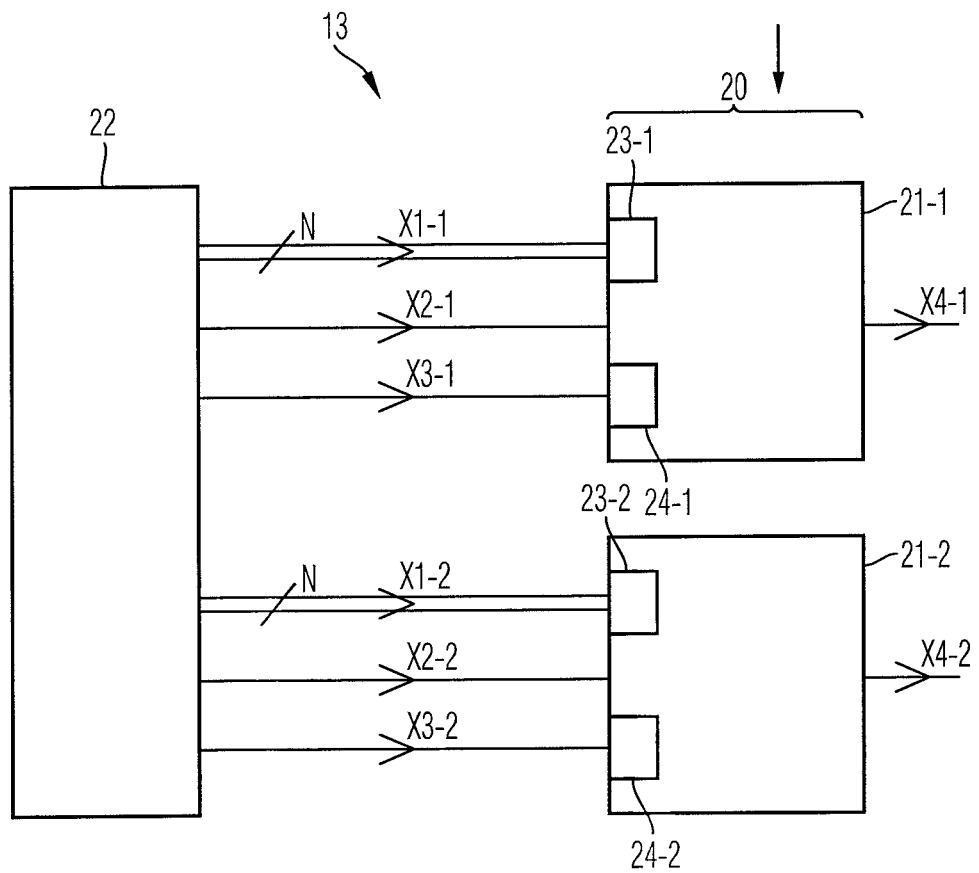
FIG. 2 is a detailed block diagram for the multi DAC arrangement of FIG. 1.

FIG. 2 shows a detailed block diagram for the multi DAC arrangement of FIG. 1. Here, the digital serial interface circuit 22 is a JESD204 interface 22 and in particular a JESD204B interface 22. Thus, the signal stream (data and control signals) produced by the digital serial interface circuit 22 is based on the JESD204 transport protocol standard.

The converter array 20 comprises an array of M DAC elements 21-1 to 21-M. In the present case, the converter array 20 comprises M=2 DAC elements 21-1, 21-2.

The digital serial interface circuit 22 is configured to provide an N-bit data stream X1-1, X1-2 to each of the DAC elements 21-1, 21-2.

Each DAC element 21-1, 21-2 is an N-bit DAC 21-1, 21-2 which is configured to convert an N-bit digital signal X1-1, X1-2 into a corresponding analogue output signal X4-1, X4-2. For this purpose, each DAC element 21-1, 21-2 comprises at its input interface a de-serializer 23-1, 23-2. This deserializer 23-1, 23-2 is configured to convert the N-bit serial data stream X1-1, X1-2 in N different input signals which are provided to respective internal input terminals of the DAC element 21-1, 21-2.

The digital serial interface circuit 22 is further configured to provide a synchronization signal X2-1, X2-2 to each DAC element 21-1, 21-2. This synchronization signal X2-1, X2-2 is used for synchronization of the different DAC elements 21-1, 21-2 within the converter array 20.

According to one aspect of the present invention, each of the DAC elements 21-1, 21-2 of the converter array 20 comprises an independent internal numerically controlled oscillator (NCO) 24-1, 24-2. This NCO is used to generate a carrier signal. Within the corresponding DAC 21-1, 21-2 this carrier signal is then used as a carrier for the data which is modulated on the carrier signal.

According to a further aspect of the present invention, the digital serial interface circuit 22 provides a control signal X3-1, X3-2 to the NCO 24-1, 24-2. This control signal X3-1, X3-2 comprises control and phase shift information. If these control and phase shift information are provided to the corresponding NCOs 24-1, 24-2 of different DAC elements 21-1, 21-2, then the analogue output signals X4-1, X4-2 produced by the DAC elements 21-1, 21-2 comprise a predefined phase shift to each other. This relationship is illustrated in FIG. 3.

The generated analogue output signals X4-1, X4-2 are then forwarded to the antennas of the output device 18. With the beamforming technique, so-called smart antennas are used within the antenna array 19. Smart antennas are arrays of antenna elements, wherein each of these antenna elements receive an analogue signal X4-1, X4-2 to be transmitted with a predetermined phase offset and a relative gain. The net effect of the antenna array 19 is to direct a transmit beam in a predefined direction. The beam is steered and formed by controlling the phase and gain relationships of the signals that excite the antenna elements of the antenna array 19.

Figure 3:
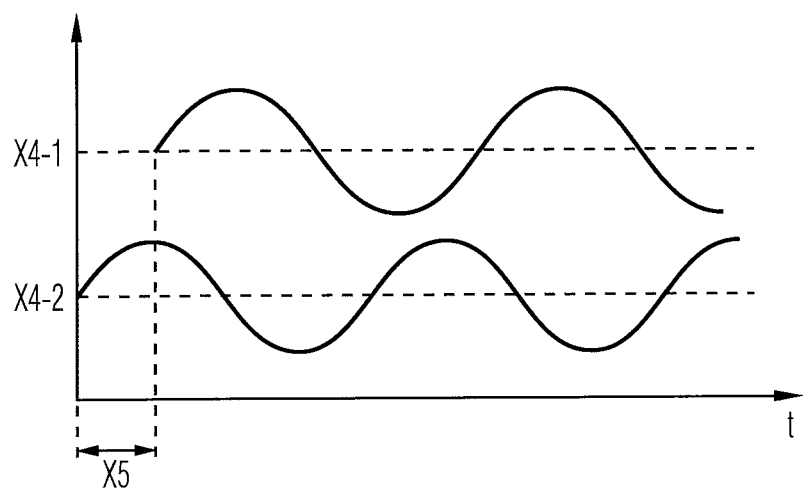
FIG. 3 is a signal-time diagram for illustrating the phase shift between two transmit signals generated by different DACs of the RF transmit circuit arrangement of FIG. 2.

FIG. 3 shows a signal-time diagram for illustrating the phase shift between the transmit signals generated by two different DACs of the RF transmit circuit arrangement of FIG. 2.

Two analogue RF data signals X4-1, X4-2 are produced by the two DAC elements 21-1, 21-2 of FIG. 2. The two analogue RF data signals X4-1, X4-2 have a predefined phase shift X5 to each other. This predefined phase shift is set and controlled via the phase shift information comprised within the control signals X3-1, X3-2 provided to the corresponding DAC elements 21-1, 21-2. This way, according to the present invention, it is possible to transfer digital data with a predefined phase shift from the digital side to the analogue side of a DAC array 20. In particular, only one control information per sample is needed for each NCO 24-1, 24-2.

Although the present invention has been described in the above by way, it is not limited thereto, but rather can be modified in a wide range of ways. In particular, the invention can be changed or modified in various ways without deviating from the core of the invention.

REFERENCE SIGNS 10 telecommunication device, RF transmit circuit arrangement
11 digital section
12 analogue section
13 multi DAC system/arrangement
14 data processor, DSP
15 digital radio circuit
16 filter
17 power amplifier
18 output device, output circuit
19 antenna array
20 DAC array
21, 21-1, 21-2 digital-to analogue converter, DAC, DAC element
22 digital serial interface circuitry
23-1, 23-2 de-serializer
24-1, 24-2 clock generator, numerically controlled oscillator, NCO
X1, X1-1, X1-2 data stream, serial data signal
X2, X2-1, X2-2 synchronization signal
X3, X3-1, X3-2 control signal
X4, X4-1, X4-2 analogue RF data signal
X5 phase shift

What is claimed is:

1. A method for controlling digital-to-analogue converters (DAC), the method comprising:
   providing a plurality of digital-to-analogue converters (DAC) of a multi-channel converter array wherein each DAC includes a separate oscillator, which is arranged inside the corresponding DAC and which operates independently from the other oscillators included in the other DACs;
   generating, by each oscillator, a separate Radio Frequency (RF) clock carrier signal;
   converting, by each DAC, digital data signals into analogue RF data signals by using the corresponding internally generated RF clock carrier signals of the corresponding oscillator;
   providing a separate control signal for triggering each of the oscillators wherein the control signals comprise control information such that when the control signals are applied to the corresponding oscillators the different analogue RF data signals provided at respective output terminals of each DAC comprise a predefined phase shift to each other;
   controlling the oscillator of each DAC directly and independently by applying the provided control signals to the corresponding oscillator; and
   coding an information of the starting phase, an increment and a point time of switching into the control signal;
   analysing this information by the corresponding DAC; and
   sample exact switching the oscillator of the corresponding DAC based on the analysed information.

2. The method of claim 1, wherein the generated analogue RF data signals are each provided to antenna elements of an antenna array.

3. The method of claim 1, wherein the method is used for beamforming.

4. The method of claim 1, wherein the digital data signals are based on the JESD204 transport protocol standard or on the JESD204B transport protocol standard.

5. The method of claim 1, wherein the control signals are based on the JESD204 transport protocol standard or on the JESD204B transport protocol standard.

6. A method for controlling digital-to-analogue converters (DAC), the method comprising:
   providing a plurality of digital-to-analogue converters (DAC) of a multi-channel converter array wherein each DAC includes a separate oscillator, which is arranged inside the corresponding DAC and which operates independently from the other oscillators included in the other DACs;

generating, by each oscillator, a separate Radio Frequency (RF) clock carrier signal;

converting, by each DAC, digital data signals into analogue RF data signals by using the corresponding internally generated RF clock carrier signals of the corresponding oscillator;

providing a separate control signal for triggering each of the oscillators wherein the control signals comprise control information such that when the control signals are applied to the corresponding oscillators the different analogue RF data signals provided at respective output terminals of each DAC comprise a predefined phase shift to each other;

controlling the oscillator of each DAC directly and independently by applying the provided control signals to the corresponding oscillator; and wherein at least one control information per sample is provided to each oscillator.

7. A method for controlling digital-to-analogue converters (DAC), the method comprising:

providing a plurality of digital-to-analogue converters (DAC) of a multi-channel converter array wherein each DAC includes a separate oscillator, which is arranged inside the corresponding DAC and which operates independently from the other oscillators included in the other DACs;

generating, by each oscillator, a separate Radio Frequency (RF) clock carrier signal;

converting, by each DAC, digital data signals into analogue RF data signals by using the corresponding internally generated RF clock carrier signals of the corresponding oscillator;

providing a separate control signal for triggering each of the oscillators wherein the control signals comprise control information such that when the control signals are applied to the corresponding oscillators the different analogue RF data signals provided at respective output terminals of each DAC comprise a predefined phase shift to each other;

controlling the oscillator of each DAC directly and independently by applying the provided control signals to the corresponding oscillator; and wherein each DAC is individually synchronized with regard to the frequency and phase of the analogue RF data signals.

8. A Radio Frequency (RF) transmit circuit arrangement, comprising:

a digital serial interface circuit;

a multi-channel converter array coupled on its digital input side to the digital serial interface circuit and having a plurality of digital-to-analogue converters (DAC) wherein each DAC includes a separate oscillator which is arranged inside the corresponding DAC, which operates independent from the other oscillators of the other DACs and which is configured to generate a separate RF clock carrier signal and wherein each DAC is configured to convert digital data signals provided by the digital serial interface circuit into analogue RF data signals; and wherein the digital serial interface circuit further comprises a control circuit which is configured to provide separate control signals for controlling the oscillators of each of the DACs directly and independently and wherein each control signal comprises control information such that the different analogue RF data signals provided at respective output terminals of each DAC comprise a predefined phase shift to each other;

wherein the digital serial interface circuit is connected to each of the DACs via a plurality of data lines for RF data signal transmission and via a first control line for synchronizing the DACs with each other and via a second control line for setting the predefined phase shift.

9. The arrangement of claim 8, wherein the digital serial interface circuit is a JESD204 interface.

10. The arrangement of claim 9, wherein the digital serial interface circuit is a JESD204B interface.

11. The arrangement of claim 8, wherein at least one oscillator is a numerically controlled oscillator (NCO).

12. The arrangement of claim 8, wherein at least one oscillator is a digitally controlled oscillator (DCO).

13. The arrangement of claim 8, wherein the RF transmit circuit arrangement is used for beamforming of RF data signals.

14. The arrangement of claim 8, further comprising an antenna array having a plurality of antenna elements, wherein each antenna element is connected on their input terminals to a corresponding output terminal of a corresponding DAC in order to provide the analogue RF data signals to the corresponding antenna elements.

15. The arrangement of claim 8, wherein the RF transmit circuit arrangement is configured to transmit radar signals.

16. The arrangement of claim 8, wherein the RF transmit circuit arrangement is configured to transmit high speed wireless communication signals.

17. The arrangement of claim 8, wherein the RF transmit circuit arrangement is configured to transmit radar signals or high speed wireless communication signals according to the Long Term Evaluation (LTE) or $5^{th}$ Generation (5G) standard.

* * * * *